United States Patent
Karim

(10) Patent No.: US 7,319,356 B1
(45) Date of Patent: Jan. 15, 2008

(54) MULTIPLEXER CIRCUIT WITH COMBINED LEVEL SHIFTING AND DELAY CONTROL FUNCTIONS

(75) Inventor: Mohammad Mahbubul Karim, Chandler, AZ (US)

(73) Assignee: Marvell International Ltd., Hamilton (BM)

( * ) Notice: Subject to any disclaimer, the term of this patent is extended or adjusted under 35 U.S.C. 154(b) by 54 days.

(21) Appl. No.: 11/303,785

(22) Filed: Dec. 16, 2005

(51) Int. Cl.
*H03K 7/00* (2006.01)

(52) U.S. Cl. ........................ 327/407; 327/333

(58) Field of Classification Search ........ 327/407–408, 327/99, 333; 326/63, 68, 80, 81
See application file for complete search history.

(56) References Cited

U.S. PATENT DOCUMENTS

| | | | | |
|---|---|---|---|---|
| 4,608,530 A | * | 8/1986 | Bacrania | 323/315 |
| 5,487,048 A | * | 1/1996 | McClure | 365/207 |
| 6,462,527 B1 | * | 10/2002 | Maneatis | 323/315 |
| 2004/0061525 A1 | * | 4/2004 | Tamaki | 326/81 |

* cited by examiner

*Primary Examiner*—Quan Tra

(57) ABSTRACT

A digitally controlled circuit is arranged to provide the combined functions of level shifting, multiplexing, and delay control functions. The circuit is compact, and uses lower power and lower overall noise susceptibility over other solutions. A programmable bias current is arranged to adjust the delay through the circuit. The bias current can be provided by a digitally controlled current source, a binary weighted current DAC, or other digitally controlled means. The multiplexing functions are provided by an input stage circuit that is current limited by the programmable bias current. An output stage is arranged to convert signals from the input stage to a desired voltage level.

11 Claims, 6 Drawing Sheets

US 7,319,356 B1

MULTIPLEXER CIRCUIT WITH COMBINED LEVEL SHIFTING AND DELAY CONTROL FUNCTIONS

FIELD OF THE INVENTION

The present invention generally relates to circuits and systems that use multiplexer circuits such as data serializers. More particularly, the present invention is related to a circuit, system, and method for providing a multiplexer with combined level shifting and delay control functions for enhanced performance in applications such as high-speed data serializers.

BACKGROUND

Computer systems and many other electronics systems often store data in a parallel format. The stored data is communicated to other portions within the system with a parallel bus architecture, where each data bit is communicated over a separate communication bus wire. Modern electronics device interfaces have begun to adopt serial communication interfaces as a way of simplifying the interface. Example electronics interfaces that includes serial communication topologies include the Universal Serial Bus (USB) Interface, IEEE 1394 "Firewire" Interface, to name a few.

A data serializer is a device that receives parallel data and converts the parallel data into a serial data stream. Data serializers are useful in many devices such as interfacing a USB device to a computer system, where the computer system has a parallel data bus and the USB device communicates with serial data. A wide variety of applications exist for data serializers such as telecommunications, data communications, backplane/cable interconnect applications, and video interface applications, to name a few. Interface circuits are also becoming available for bi-directional communications that includes both serializing and de-serializing functions.

BRIEF DESCRIPTION OF THE DRAWINGS

Non-limiting and non-exhaustive embodiments are described with reference to the following drawings.

DETAILED DESCRIPTION OF THE PREFERRED EMBODIMENT

Figure 1:
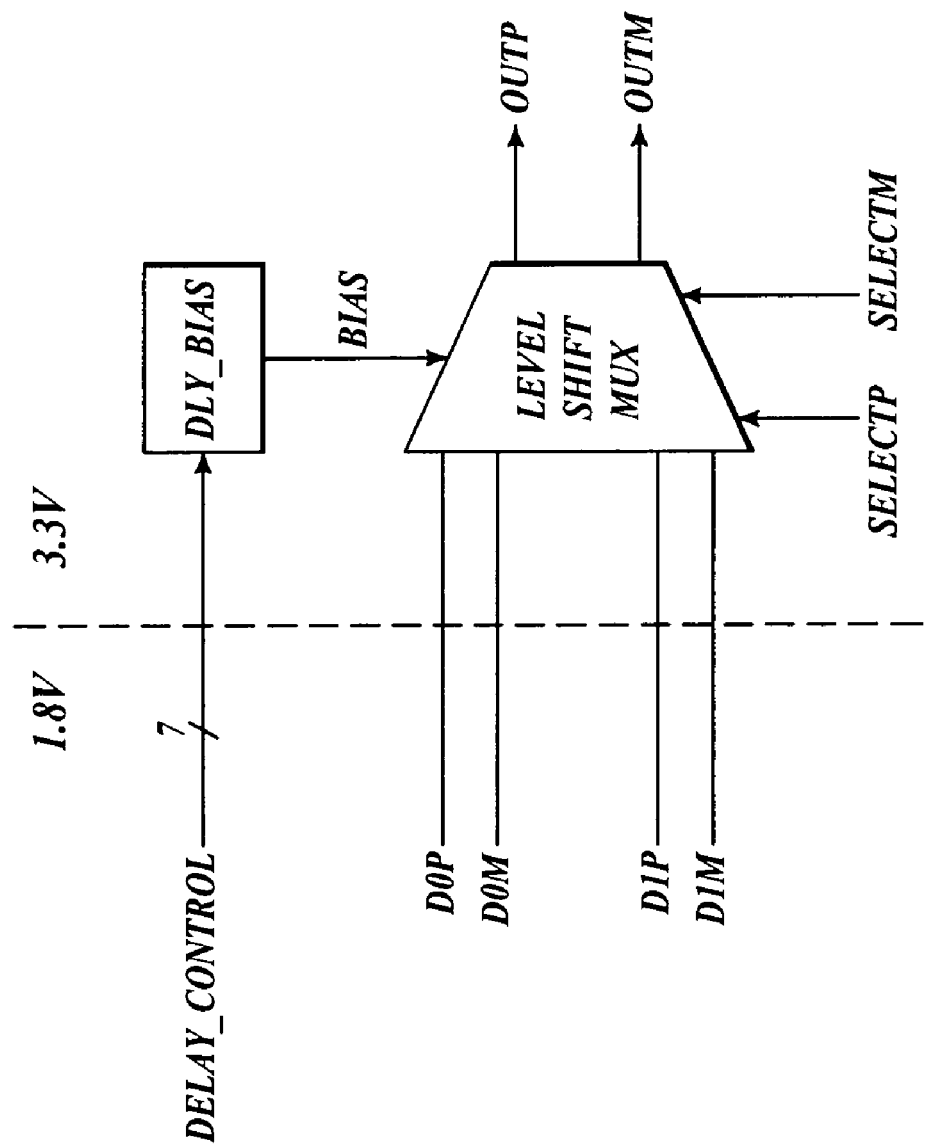
FIG. 1 is a schematic diagram of a level shifting multiplexer that is arranged in accordance with an embodiment of the present disclosure.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, data, or other signal.

Briefly stated, a digitally controlled circuit is arranged to provide the combined functions of level shifting, multiplexing, and delay control functions. The circuit is compact, and uses lower power and lower overall noise susceptibility over other solutions. A programmable bias current is arranged to adjust the delay through the circuit. The bias current can be provided by a digitally controlled current source, a binary weighted current DAC, or other digitally controlled means. The multiplexing functions are provided by an input stage circuit that is current limited by the programmable bias current. An output stage is arranged to convert signals from the input stage to a desired voltage level.

FIG. 1 is a schematic diagram FIG. 1 is a schematic diagram of a multiplexer circuit that is arranged in accordance with an embodiment of the present disclosure. The multiplexer circuit includes a level shifting multiplexer (LEVEL SHIFT MUX) and a delay bias circuit (DLY_BIAS).

The level shifting multiplexer circuit includes a first data input terminal, a second data input terminal, a bias control input terminal, a selection control input terminal, a bias control terminal, and an output terminal. The first data input terminal is arranged to receive a first data input signal (D0P, D0M). The second data input terminal is arranged to receive a second data input signal (D1P, D1M). The selection control input terminal is arranged to receive a selection control signal (SELECTP, SELECTM). The bias control terminal is arranged to receive a bias control signal (BIAS), which is provided from an output of the delay bias circuit (DLY_BIAS). The delay bias circuit includes a delay adjustment control terminal that is arranged to receive a delay adjustment control signal (DELAY CONTROL). The D0P and D0M signals form a complementary input signal (e.g., inverse logic related). Similarly, additional signal pairs are also complementary such as: D1P, D1M and SELECTP, SELECTM.

The level shifting multiplexer circuit is arranged to provide an output signal (OUTP, OUTM) in response to a selected one of the data input signals (D0P, D0M; D1P, D1M) as determined by the selection control signal (SELECTP, SELECTM). The output signal (OUTP, OUTM) is related to the selected data input signal, but is level shifted from the data input power supply levels and the desired output supply levels. The edge rate for transitions between the logic high and logic low levels in the output signal (OUTP, OUTM) can be adjusted by the bias control signal (BIAS) such the effects of signal delays through each signal path can be equalized for a desired performance.

The input data is illustrated as a pair of signals such as from differential signals (e.g., USB, LVDS, etc). The selection control signal is illustrated as a selection signal (SELECTP) and the complement of the selection signal (SELECTM). The same circuit topology will also work for single-ended signals (control signals and/or data signals) that are referenced to a signal ground. The input signals are illustrated as in a 1.8V power-supply domain, while the output signals are illustrated as in the 3.3V power-supply domain. The delay control signal illustrated as a 7 bit control signal, but any appropriate control mechanism may be used such as a multi-bit digital control signal, and an analog control signal. The output of the circuit provides true and complement form of the multiplexed data.

A truth table for the described multiplexer operation is illustrated below.

| SELECT | D1 | D0 | OUTP | OUTM |
|--------|----|----|------|------|
| L | X | L | L | H |
| L | X | H | H | L |
| H | L | X | L | H |
| H | H | X | H | L |

Figure 2:
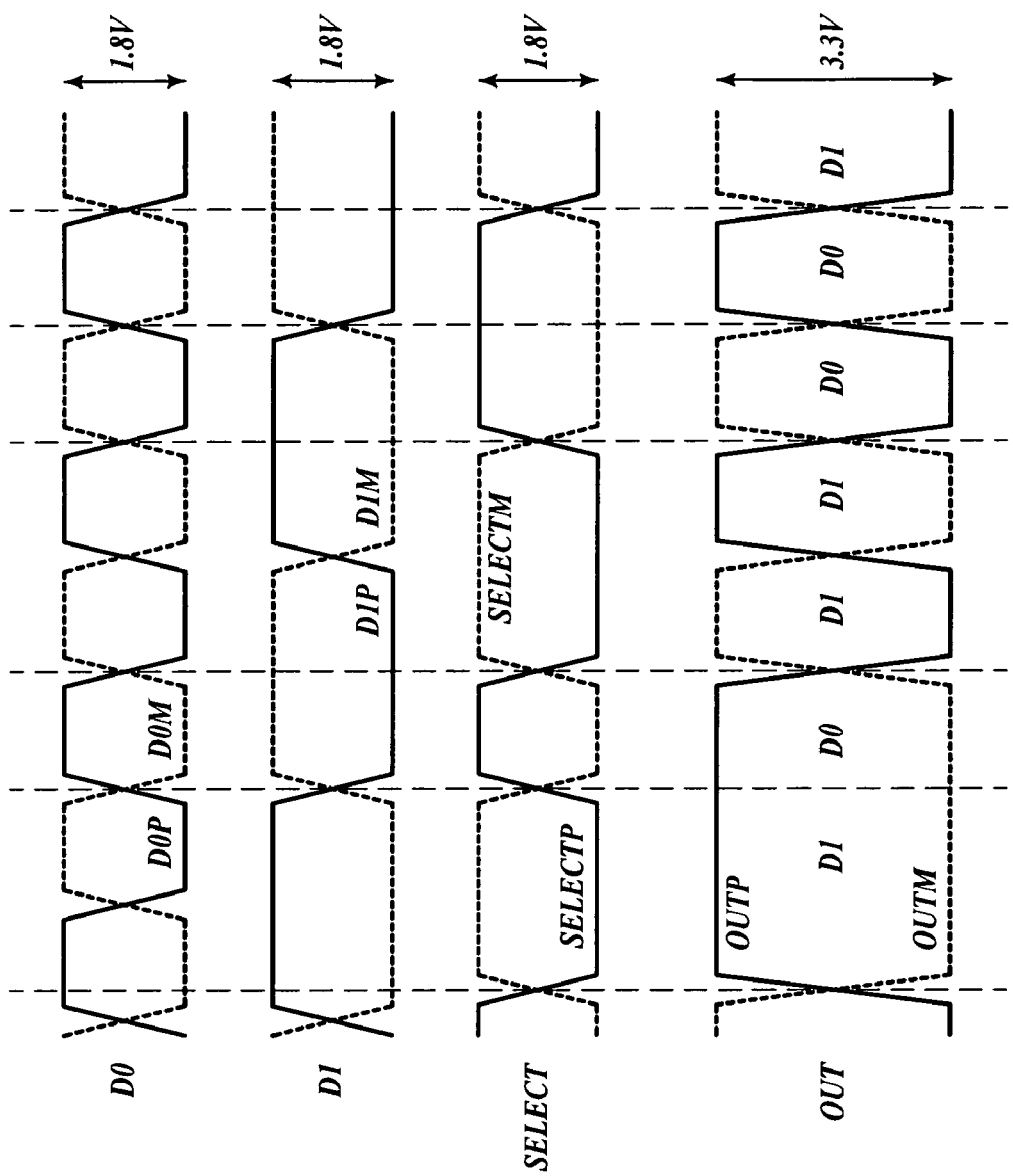
FIG. 2 is a timing diagram of waveforms for a level shifting multiplexer circuit that is arranged in accordance with the present disclosure.

FIG. 2 is a timing diagram of waveforms for a level shifting multiplexer circuit that is arranged in accordance with the present disclosure. As illustrated, the input data signals (D0, D1) and the section control signal (SELECT) are operated on first power-supply levels (e.g., 1.8V), while the output signal (OUT) is operated at second power supply levels (e.g., 3.3V). The illustrated multiplexing operation includes differential input signals and differential output signals to prevent noise and other problems that may occur. However, in some embodiments single ended signals may be used.

Figure 3:
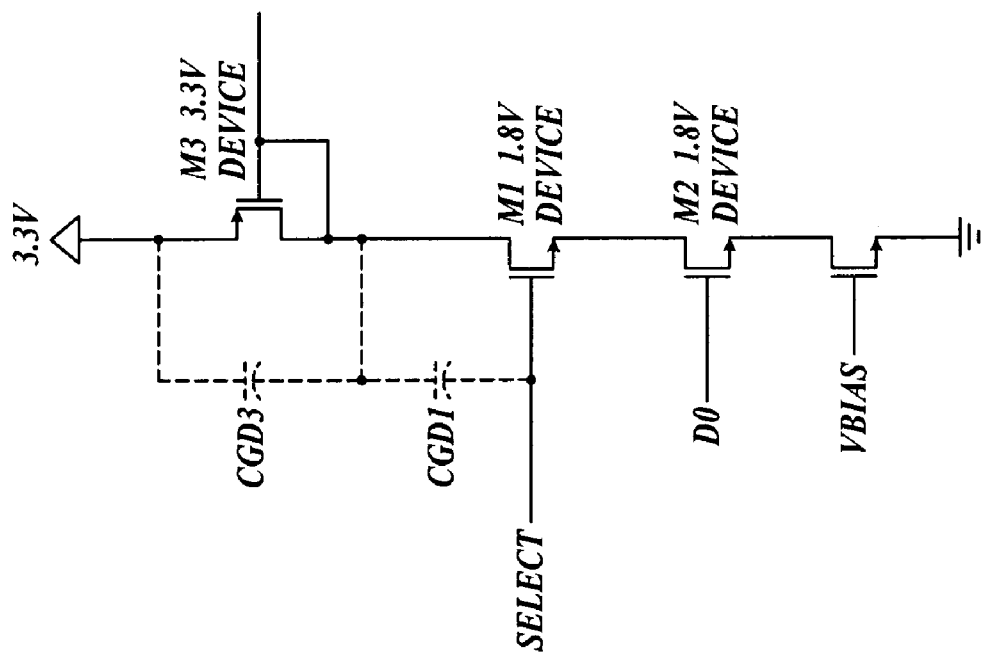
FIG. 3 is a schematic diagram of a portion of a level shifting multiplexer circuit that is arranged in accordance with the present disclosure.

FIG. 3 is a schematic diagram of a portion of a level shifting multiplexer circuit that is arranged in accordance with the present disclosure. The circuit includes a four transistor devices. The first transistor device (M1) is responsive to a selection control signal (SELECT). The second transistor device (M2) is coupled between the first transistor device (M1) and a current source transistor. Transistor M2 is responsive to changes in the data signal (D0). The current source transistor is biased as a current source with a control voltage (VBIAS). An output is from the gate/drain connection of transistor M3, which is coupled to a drain of transistor M1.

The input data and the select signals are in low voltage domain where as the outputs are in high voltage domain. The low voltage domain has reduced power consumption, such that it is appropriate for signal processing functions. The multiplexer circuit uses both low voltage device (e.g., M1, M2) and high voltage devices (e.g. M3) but due to charge sharing between the cascaded devices, the low voltage devices are safe from potential junction breakdown. For a selection control input (SELECT) corresponding to 0 V, with 3.3 V supply, the voltage at the gate of transistor M1 is substantially lower due to the voltage division by the parasitic capacitance (Cgd1 and Cgd3) between the gate and drain of transistors M1 an M3, respectively.

The switching between the two multiplexed input signals can be done by cascaded differential pair structures such that equal rise and fall times are ensured. If the Select inputs are 50% duty cycle, the output duty cycle also remains 50%.

The biasing voltage that is applied to the gate of the current source transistor can be increased for faster edge transitions, or decreased to slow down edge transitions as may be desired to conserve power and achieve a desired operating speed. Constant current operation can be applied to the current source operation such that the total current remains relatively constant and no switching noise is injected in the power supply.

The delay through the multiplexer is controlled by a biasing signal that is adjusted in response to at least one of: a resistor, a current source, a programmable current course, a biased transistor, a diode coupled transistor, and an N-bit binary weighted current DAC, or any other reasonable adjustment mechanism. In one example that is illustrated in FIG. 6B, a 7-bit binary weighted Current DAC can be used to adjust the biasing.

Figure 4:
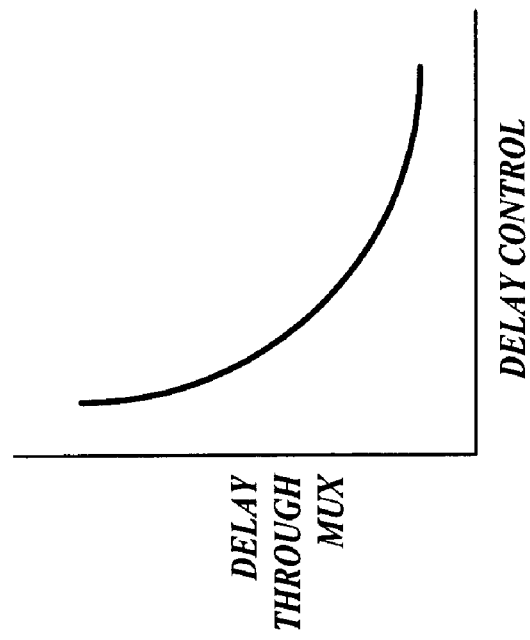
FIG. 4 is graph illustrating delay control operation in a level shifting multiplexer circuit that is arranged in accordance with the present disclosure

Faster edge transitions can be achieved in the multiplexer circuit by increasing the bias current such that the overall propagation delay through the multiplexer can be controlled. FIG. 4 is graph illustrating delay control operation in a level shifting multiplexer circuit that is arranged in accordance with the present disclosure. As illustrated in FIG. 4, the delay through the multiplexer circuit is non-linear in nature such that increasing the bias control value (DELAY CONTROL) decreases the delay through the circuit.

Figure 5:
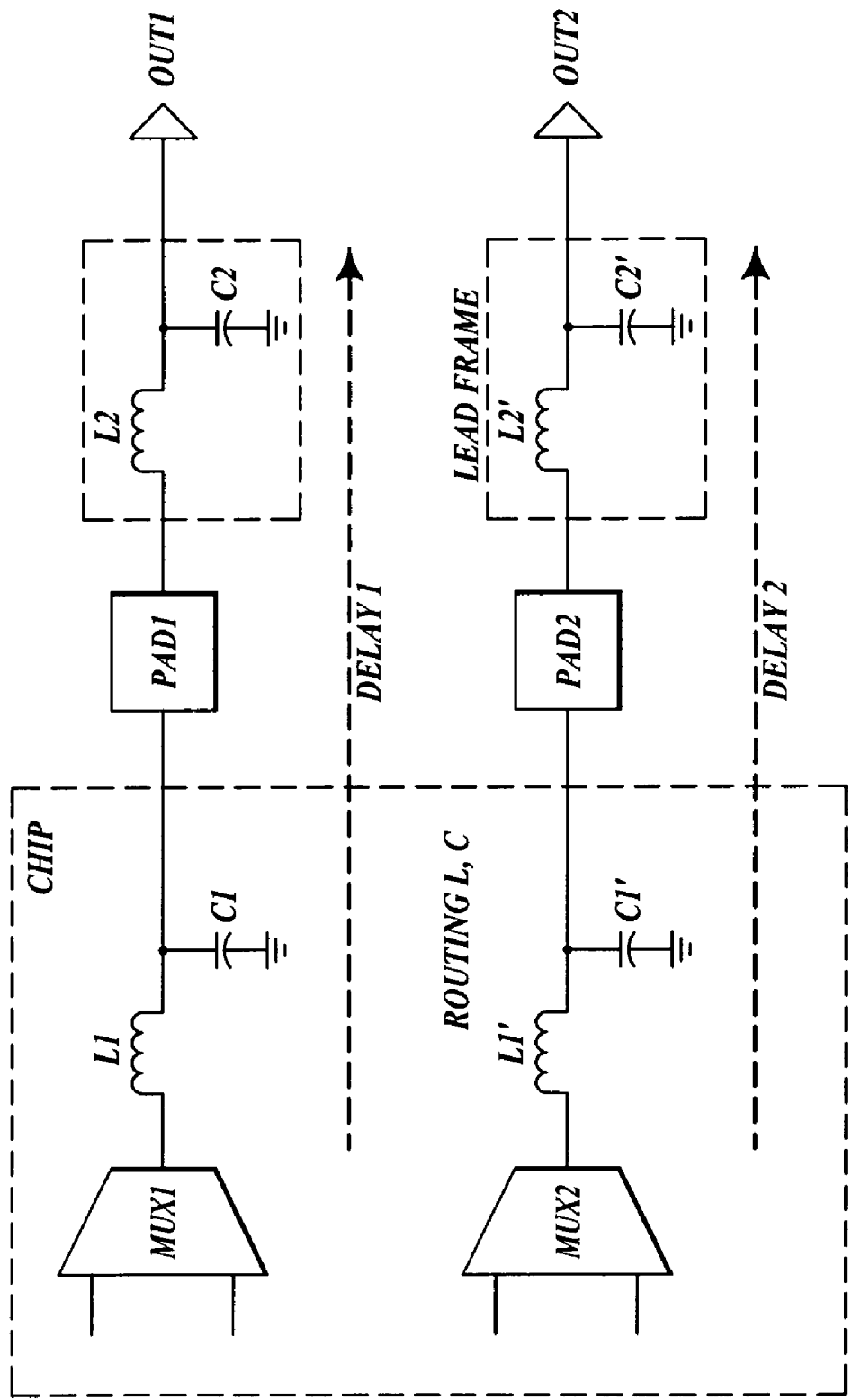
FIG. 5 is a diagram illustrating skewing effects on an example level shifting multiplexer circuit that is arranged in accordance with the present disclosure.

FIG. 5 is a diagram illustrating skewing effects on an example level shifting multiplexer circuit that is arranged in accordance with the present disclosure. A chip with more than one multiplexed output may have different delay times between the multiplexer output and any receiving circuit for the output. The skewing that may occur between the various multiplexers can be worse depending on parasitic effects such as parasitic capacitance, inductance and/or resistance from any of the: wires, metallization in an integrated circuit, bonding pads, lead frames, bonding wires, and circuit boards to name a few.

As illustrated in FIG. 5, a first signal path may have a first delay characteristic (delay 1) that is the result of various on-chip parasitic inductance (L1) and capacitance (C1), as well as any bonding pad (PAD1) effects, and off-chip parasitic inductance (L2) and capacitance (C2). A second signal path may have a different delay characteristic (delay 2) that is the result of different on-chip parasitic inductance (L1') and capacitance (C1), different bonding pad (PAD2) effects, and/or different off-chip parasitic inductance (L2) and capacitance (C2). The different parasitic effects result in a difference in the delay times that is observed as a skewing between the output signals even when care is taken to make the paths identical. At high frequency operation, the skew control becomes an important factor and the delay control in the presently described multiplexer circuit provides an adjustment mechanism to exactly match the output timings.

Figure 6A:
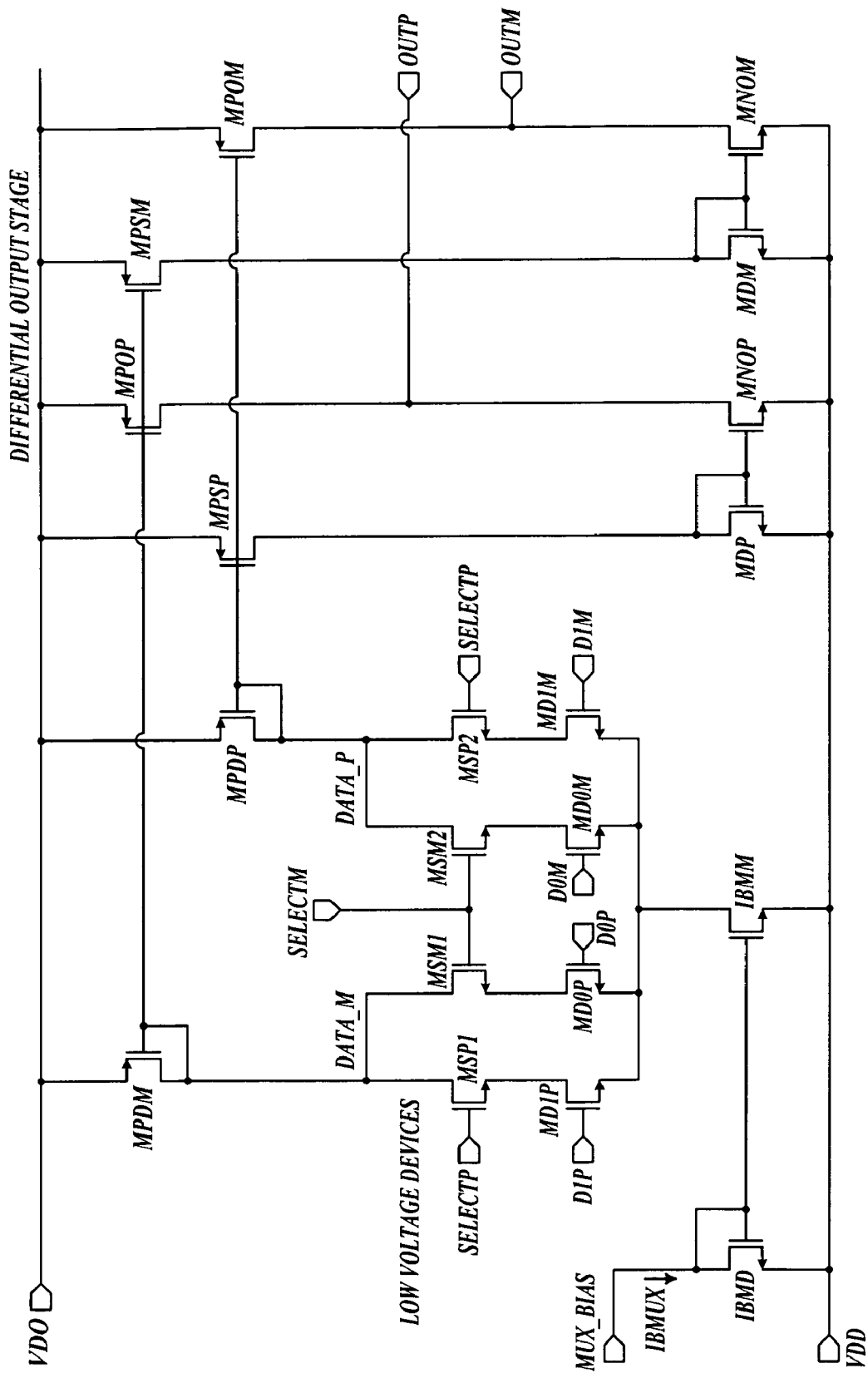
FIGS. 6A and 6B illustrate a detailed example of a level shifting multiplexer circuit that is arranged in accordance with the present disclosure.
Figure 6B:
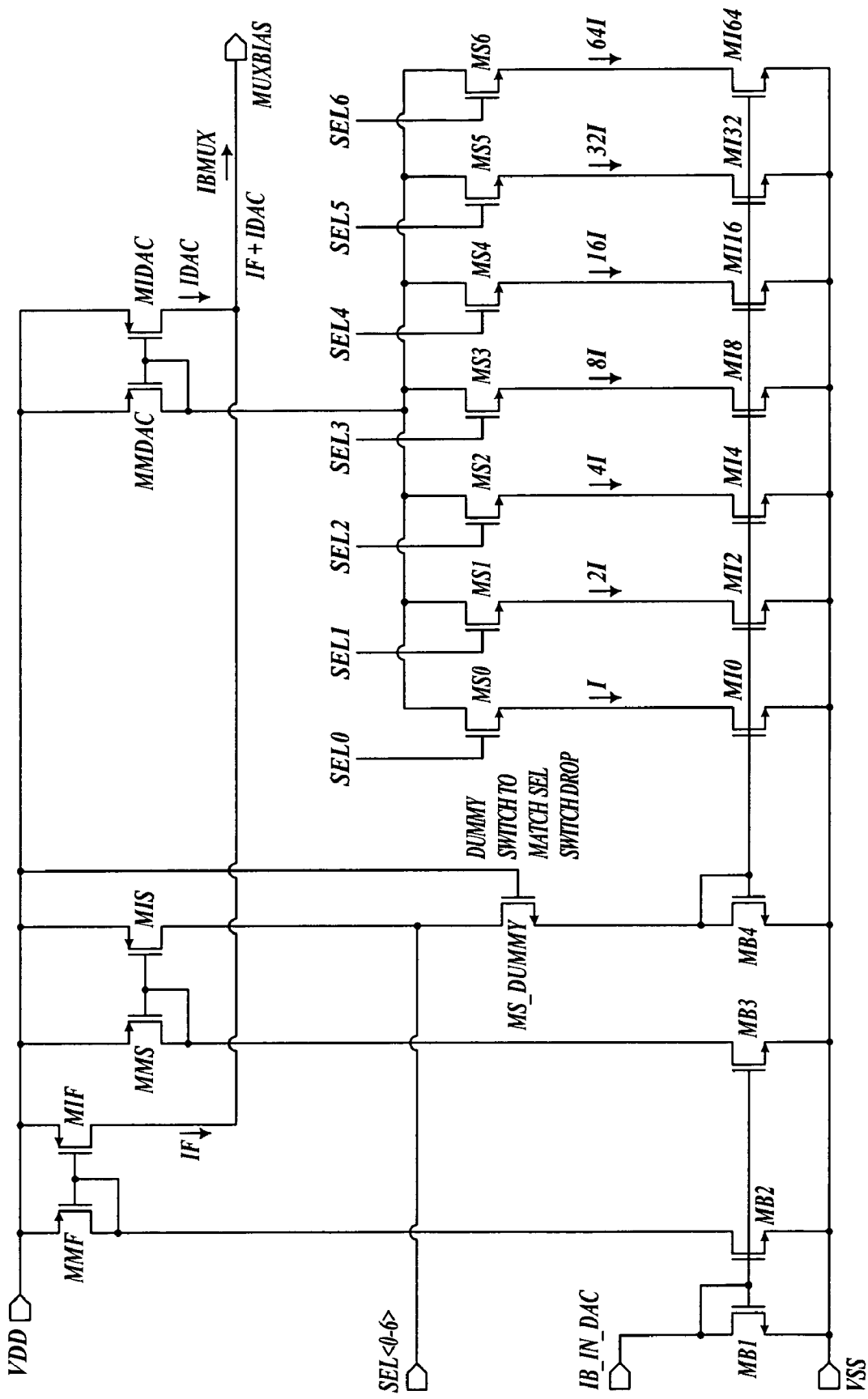

FIGS. 6A and 6B illustrate a detailed example of a level shifting multiplexer circuit that is arranged in accordance with the present disclosure. FIG. 6A illustrates a level shifting multiplexer while FIG. 6B illustrates a delay control circuit for the level shifting multiplexer circuit of FIG. 6A.

The example level shifting multiplexer circuit is a differential circuit that includes a differential input stage and a differential output stage.

The differential input stage includes: four select transistors (MSO1, MSM1, MSM2, and MSP2), four switching transistors (MD0P, MD0M, MD1P, and MD1M), a current source transistor (IBMM), and a biasing transistor (IBMD). The current source transistor is biased to provide a current to the differential input stage that depends on the current reference IBMUX flowing through the biasing transistor (IBMD). The SELECTP signal is arranged to activate transistors MSP1 and MPS2 when asserted, while the SELECTM signal is arranged to activate transistors MSM1 and MSM2 when asserted. SELECTP and SELECTM are complementary signals. A differential pair circuit is formed with transistors MD1P and MD1M when SELECTP is asserted, where the differential pair is responsive to signals DIP and D1M. Another differential pair circuit is formed with transistors MD0P and MD0M when SELECTM is asserted, where the differential pair is responsive to signals D0P and D0M. Each differential pair is arranged to selectively steer current from transistor IBMM between the diode coupled transistors MPDM and MPDP. The diode coupled transistors operate as the output nodes of the differential input stage.

The differential output stage includes at least transistors MPSP, MPOP, MPSM, MPOM, MDP, MNOP, MDM, and MNOM. Transistor MDP will activate transistor MNOP when transistor MPSP is activated in response to a first output of the differential input stage (DATA_P). Transistor MDM will activate transistor MNOM when transistor MPSM is activated in response to a second output of the differential input stage (DATA_M). The activation of transistor MNOP will decrease signal amplitude OUTP, while activation of transistor MPOP will increase the signal amplitude of OUTP. Similarly, the activation of transistor MNOM will decrease signal amplitude OUTM, while activation of transistor MPOM will increase the signal amplitude of OUTM. The rate of the transition between one output polarity and another is dependent on the conduction current in the differential pair.

The delay control circuit from FIG. 6B is arranged to provide a multiplexer biasing signal (MUX BIAS) that includes a fixed biasing portion (IF) and a variable biasing portion (IDAC).

The fixed biasing portion (IF) is provided by transistors MB1, MB2, MMF and MIF. Transistor MB1 can be biased by an externally provided component such as a resistor, a current source, etc. Transistors MB2 and MB3 are biased in common with transistor MB1. Transistor MMF is configured as a current mirror with transistor MIF, and also biased by transistor MB2.

The variable biasing portion (IDAC) is provided by a current DAC, which is illustrated as a 7-bit current DAC. Transistors MB3, MMS, MIS, MS_DUMMY, and MB4 are arranged to provide a biasing signal to transistors MI0, MI2, MI4, MI8, MI16, MI32 and MI64, which are each arranged to operate as a binary power of a unit current source. Transistors MS0-MS6 are switching transistors that are necessary to select each current source in the current DAC. Current from the selected switching transistors are combined by transistor MMDAC, which is arranged in a current mirror configuration with transistor MIDAC. Transistor MIDAC is arranged to provide the variable portion of the multiplexer biasing signal.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A multiplexing apparatus, comprising:
   a delay bias circuit that is arranged to provide a bias control signal; and
   a level shifting multiplexer circuit that is arranged to:
      select one of a first data input and a second data input to provide a selected data input, wherein a power-supply range associated with the selected data input corresponds to a first power supply level;
      level shift the selected data input from the first power supply level to a second power supply level;
      analyze a delay time associated with a transition in an output of the multiplexer circuit in response to a corresponding transition in the selected data input; and
      control the delay time associated with the transitions between logic levels in the output of the level shifting multiplexer by adjusting a biasing current associated with the level shifting multiplexer circuit in response to the bias control signal, wherein the bias control signal is varied based on the analyzed delay time.

2. The multiplexing apparatus of claim 1, wherein the delay bias control circuit comprises at least one of: a current source, a programmable current source, a biased transistor, a diode coupled transistor, and an N-bit binary weighted current DAC.

3. The multiplexing apparatus of claim 1, wherein the delay bias control circuit comprises: a binary weighted current DAC circuit that is arranged to provide a biasing signal in response to a combination of a fixed current signal and a variable current signal, wherein the variable current signal is adjusted in response to a delay control signal.

4. The multiplexing apparatus of claim 3, wherein the fixed current signal is selected by a current source.

5. The multiplexing apparatus of claim 3, wherein the variable current signal is selected by at least one of an N-bit binary weighted current DAC, wherein the variable current signal corresponds to: IDAC=IREF*(sel0+sel1*2+sel2*4 . . . +selN−1*2N−1).

6. The multiplexing apparatus of claim 1, wherein the level shifting multiplexer circuit comprises: a differential input stage and a differential output stage, wherein a speed associated with a transition in a signal at the differential input stage is determined by the biasing current.

7. The multiplexing apparatus of claim 6, wherein the differential input stage comprises: a first transistor circuit that is arranged to provide the biasing current in response to the bias signal such that the biasing current is approximately constant, a first differential pair circuit that is arranged to steer at least a portion of the biasing current in response to the first data input, and a transistor circuit that is arranged to sense the output condition from the at least the portion of the biasing current that is steered.

8. A multiplexing apparatus, comprising:
   a delay bias means that is arranged to provide a bias control signal; and
   a multiplexer means that includes:
      a data signal selection means that is arranged to select one of a first data input and a second data input to provide a selected data input, wherein a power-supply range associated with the selected data input corresponds to a first power supply level;

a level shifting means that is arranged to level shift the selected data input from operating on a first power supply level to operating on a second power supply level; and a delay time control means that is arranged to analyze a delay time associated with a transition in an output of the multiplexer means in response to a corresponding transition in the selected data input and adjust a biasing current associated with the multiplexer means in response to the bias control signal, wherein the biasing control signal is varied based on the analyzed delay time.

9. An apparatus, comprising:

a first multiplexing apparatus that has a first delay characteristic, wherein the first multiplexing apparatus is arranged to:

select one of a first data input and a second data input to provide a selected data input, wherein a power-supply range associated with the selected data input corresponds to a first power supply level;

level shift the selected data input from the first power supply level to a second power supply level; and control the delay time associated with the transitions between logic levels in the output of the first multiplexing apparatus by adjusting a first biasing current in response to a first bias control signal;

a second multiplexing apparatus that has a second delay characteristic that is different from the first parasitic delay characteristic, wherein the second multiplexing apparatus is arranged to:

select one of a third data input and a fourth data input to provide a second selected data input, wherein the power-supply range associated with the second selected data input corresponds to the first power supply level;

level shift the second selected data input from the first power supply level to the second power supply level; and control the delay time associated with the transitions between logic levels in the output of the second multiplexing apparatus by adjusting a second biasing current associated with the second multiplexing apparatus in response to a second bias control signal;

a delay bias circuit that is arranged to adjust the first bias control signal such that the adjusted first delay characteristic is substantially matched to the second delay characteristic.

10. A method of adjusting delay times in a multiplexer circuit, comprising:

selecting one of a first data input and a second data input to provide a selected data input in a multiplexer circuit that includes delay control adjustment means, wherein a power-supply range associated with the selected data input corresponds to a first power supply level;

level shifting the selected data input from the first power supply level to a second power supply level in the multiplexer circuit;

analyzing a delay time associated with a transition in an output of the multiplexer circuit in response to a corresponding transition in the selected data input; and varying a biasing control signal based on the analyzed delay time.

11. A method of adjusting delay times in a multiplexer circuit, comprising:

selecting one of a first data input and a second data input to provide a selected data input in a first multiplexer circuit that includes delay control adjustment means, wherein a power-supply range associated with the selected data input corresponds to a first power supply level;

level shifting the selected data input from the first power supply level to a second power supply level in the first multiplexer circuit;

analyzing a delay time associated with a transition in an output of the multiplexer circuit in response to a corresponding transition in the selected data input;

selecting one of a third data input and a fourth data input to provide a second selected data input in a second multiplexer circuit that includes a second delay control adjustment means, wherein the power-supply range associated with the second selected data input corresponds to the first power supply level;

level shifting the second selected data input from the first power supply level to the second power supply level in the second multiplexer circuit;

analyzing a second delay time associated with a transition in an output of the second multiplexer circuit in response to a corresponding transition in the second selected data input; and varying one of the delay control adjustment means such that the first delay time and the second delay time are substantially matched to one another.

* * * * *